US012795838B2

(12) United States Patent
Matias

(10) Patent No.: US 12,795,838 B2

(45) Date of Patent: Nov. 10, 2026

(54) WIRELESS NANO RECEIVER DONGLE

(71) Applicant: THE MATIAS CORPORATION, Newmarket (CA)

(72) Inventor: Edgar Matias, Newmarket (CA)

(73) Assignee: THE MATIAS CORPORATION, Newmarket (CA)

(*) Notice: Subject to any disclaimer, the term of this patent is extended or adjusted under 35 U.S.C. 154(b) by 114 days.

(21) Appl. No.: 18/655,888

(22) Filed: May 6, 2024

(65) Prior Publication Data

US 2024/0397642 A1 Nov. 28, 2024

Related U.S. Application Data

(60) Provisional application No. 63/503,738, filed on May 23, 2023.

(51) Int. Cl.

*H05K 5/00* (2025.01)
*H05K 1/02* (2006.01)
*H05K 5/06* (2006.01)

(52) U.S. Cl.

CPC ........... *H05K 5/0091* (2013.01); *H05K 1/028* (2013.01); *H05K 5/069* (2013.01)

(58) Field of Classification Search

CPC ...... H05K 5/0091; H05K 1/028; H05K 5/069; G06F 2203/0384; G06F 3/038; G06K 19/07732

See application file for complete search history.

(56) References Cited

U.S. PATENT DOCUMENTS

| | | | | |
|---|---|---|---|---|
| 5,008,496 A * | 4/1991 | Schmidt | H05K 1/0284 29/829 |
| 6,229,097 B1 * | 5/2001 | Suppelsa | H05K 1/16 338/195 |
| 6,259,039 B1 * | 7/2001 | Chroneos, Jr. | H01R 43/0256 361/791 |
| 6,673,697 B2 * | 1/2004 | Ma | B81B 7/0006 438/455 |
| 6,903,452 B2 * | 6/2005 | Ma | B81B 7/0006 257/680 |
| 7,259,967 B2 | 8/2007 | Ni | |
| 7,359,208 B2 | 4/2008 | Ni | |
| 7,748,995 B1 | 7/2010 | Lee | |
| 7,824,227 B1 | 11/2010 | Lee et al. | |
| 7,833,056 B1 | 11/2010 | Lee et al. | |
| 8,517,751 B1 | 8/2013 | Golko et al. | |
| 9,431,772 B2 | 8/2016 | Gao et al. | |
| 9,640,885 B2 | 5/2017 | Amini et al. | |
| 9,730,363 B2 * | 8/2017 | Kawano | H05K 7/026 |
| 9,844,149 B2 * | 12/2017 | Cariou | H01Q 9/42 |
| 10,229,770 B2 | 3/2019 | Cornelius et al. | |
| 10,299,326 B2 * | 5/2019 | Thompson | H05B 45/10 |
| 11,030,427 B2 * | 6/2021 | Haertel | G06K 7/00 |

(Continued)

OTHER PUBLICATIONS

U.S. Appl. No. 18/655,888, Wireless Nano Receiver Dongle, filed May 6, 2024.

*Primary Examiner* — Imani N Hayman
*Assistant Examiner* — Theron S Milliser
(74) *Attorney, Agent, or Firm* — Perry + Currier

(57) ABSTRACT

A wireless receiver dongle for very small connectors (such as USB-C or Apple Lightning connector) that is thin enough to sit nearly flush to the computer host device, into which it is inserted.

12 Claims, 5 Drawing Sheets

(56) References Cited

U.S. PATENT DOCUMENTS

| | | | | |
|---|---|---|---|---|
| 11,601,746 | B2 * | 3/2023 | Schreuder | H01Q 1/24 |
| 12,003,024 | B2 * | 6/2024 | Chiu | H01Q 1/2291 |
| 12,261,358 | B2 * | 3/2025 | Chiu | H01Q 1/2275 |
| 2003/0189242 | A1 * | 10/2003 | Ma | B81B 7/0006 257/678 |
| 2004/0051181 | A1 * | 3/2004 | Ma | B81B 7/0006 257/734 |
| 2010/0267285 | A1 | 10/2010 | Wang | |
| 2011/0039426 | A1 | 2/2011 | Lee | |
| 2014/0028501 | A1 * | 1/2014 | Cariou | H01Q 1/2275 343/700 MS |
| 2014/0028502 | A1 * | 1/2014 | Cariou | H01Q 1/44 29/840 |
| 2014/0029215 | A1 * | 1/2014 | Cariou | H01Q 9/42 361/752 |
| 2015/0123853 | A1 * | 5/2015 | Wu | H01Q 5/371 343/700 MS |
| 2015/0124409 | A1 * | 5/2015 | Kawano | H05K 7/20509 361/728 |
| 2017/0237202 | A1 | 8/2017 | Gao et al. | |
| 2018/0109881 | A1 * | 4/2018 | Chew | H04R 25/402 |
| 2018/0302964 | A1 * | 10/2018 | Thompson | G06F 13/4282 |
| 2020/0285819 | A1 * | 9/2020 | Haertel | G06K 7/10316 |
| 2021/0176557 | A1 * | 6/2021 | Schreuder | H01Q 1/24 |
| 2021/0289646 | A1 * | 9/2021 | Lin | G06K 19/07733 |
| 2022/0174821 | A1 | 6/2022 | Lee et al. | |
| 2022/0320708 | A1 * | 10/2022 | Hojo | H01Q 1/38 |
| 2023/0055579 | A1 * | 2/2023 | Chiu | H05K 7/1427 |
| 2024/0147646 | A1 * | 5/2024 | Lin | H05K 5/0247 |
| 2024/0235015 | A1 * | 7/2024 | Chiu | H01Q 1/2275 |
| 2024/0397642 | A1 * | 11/2024 | Matias | H05K 5/0091 |

* cited by examiner

WIRELESS NANO RECEIVER DONGLE

BACKGROUND OF THE INVENTION

1. Field of the Invention

The present invention relates generally to computer dongles and, more particularly, to a wireless dongle suitable for keyboards and mice.

2. Description of the Related Art

A dongle is a small piece of computer hardware that connects to a port on a host device (e.g. a computer or tablet) to provide additional functionality to the host device, or enable a pass-through to such a device that adds functionality. A nano receiver is a wireless dongle that protrudes as little as possible, when connected, from a host device. Conventional nano receivers have a thick and rigid multi-layer printed circuit board (PCB) with the circuit on the inside, wireless components mounted on the outside surface of the PCB (around the circuit), and edge connector traces printed on the PCB surface that serve as connector contacts, all of which are enclosed in a metal housing that forms an outside shield for the connector. When a nano receiver is inserted into a host device, virtually all of the components are held inside the host device, with only the plastic housing containing the antenna protruding from the host device.

U.S. Pat. No. 9,844,149 (Cariou et al.) discloses a configuration of nano receiver that attaches via a USB-A connector (i.e. the type of connector conventionally used to connect wireless keyboards and mice), which is sufficiently large that the requisite wireless components can be mounted inside the connector housing, with only the antenna protruding.

More recent connector designs are smaller than the now ubiquitous USB-A connector, which was introduced in 1996. Such newer connector designs include the proprietary Lightning™ connector by Apple® (2012) and the standard USB-C connector (2014). However, such smaller connectors cannot be configured as nano receivers because there is insufficient space inside the connector housing for additional components. This requires all of the electronics to be mounted outside of the connector housing. Consequently, wireless receivers for USB-C are larger in size than nano receivers.

The following prior art is relevant: U.S. Pat. No. 7,259,967 (Ni); U.S. Pat. No. 7,359,208 (Ni); U.S. Pat. No. 7,748,995 (Lee); U.S. Pat. No. 7,824,227 (Lee et al.); U.S. Pat. No. 7,833,056 (Lee et al.); U.S. Pat. No. 8,517,751 (Golko et al.); U.S. Pat. No. 9,431,772 (Gao et al.); U.S. Pat. No. 9,640,885 (Amini et al.); U.S. Pat. No. 10,229,770 (Cornelius et al.); 2010/0267285 (Wang); 2011/0039426 (Lee) and 2017/0237202 (Gao et al.).

SUMMARY OF THE INVENTION

It is an aspect of the present invention to provide a wireless nano receiver dongle for USB-C, and other comparably small connectors wherein a surface-mount USB-C connector (or the like) is soldered to a thin and flexible PCB, such that it is perpendicular to the PCB surface.

The above aspects can be attained by a wireless nano receiver dongle, comprising a flexible printed circuit board assembly having a surface, and a surface-mount connector connected perpendicular to the surface system.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE PREFERRED EMBODIMENTS

Figure 1:
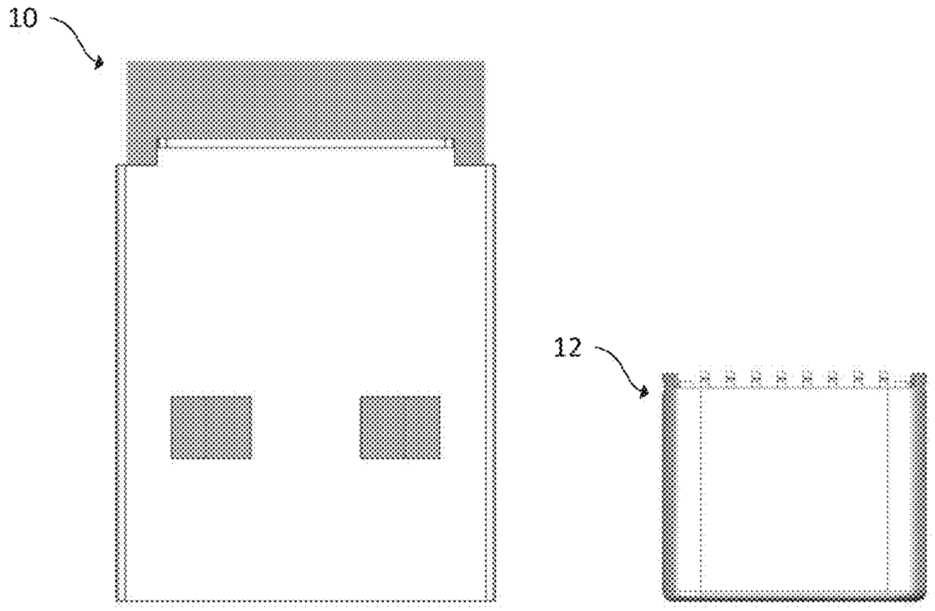
FIG. 1 (PRIOR ART)
FIG. 1 shows a prior art USB-A connector and a prior art USB-C connector, for size comparison.

As discussed above, recent connector designs, such as USB-C and the proprietary Lightning connector by Apple are smaller than USB-A connectors. However, such smaller connectors cannot be configured as nano receivers because there is insufficient space inside the connector housing for the required components. For comparison purposes, FIG. 1 shows a prior art USB-A connector 10 beside a much smaller USB-C connector 12.

Figure 2:
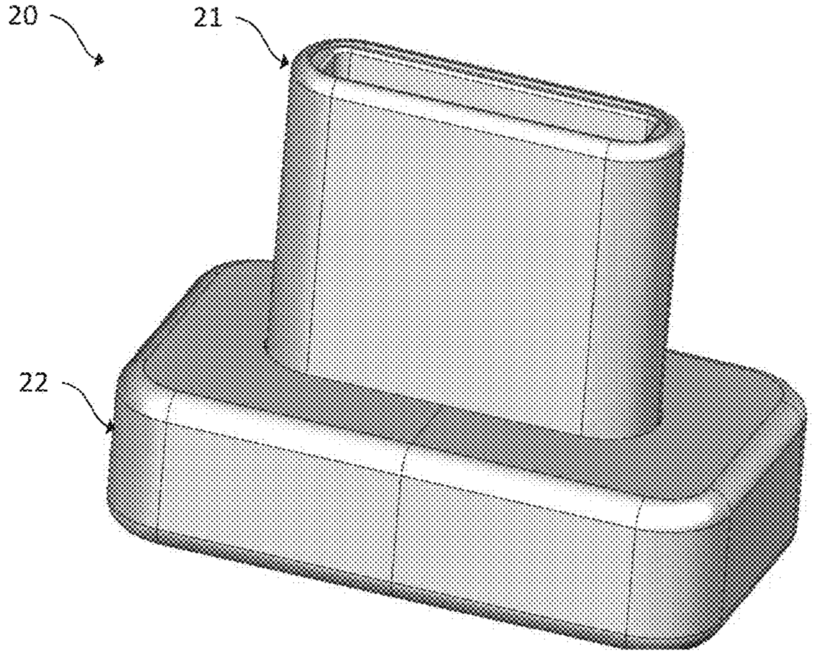
FIG. 2 is a perspective view of a wireless dongle having a connector and housing, according to an embodiment.

FIG. 2 is a perspective view of a wireless dongle 20, according to an embodiment, having a connector 21 protruding from a housing 22. In one embodiment, connector 21 is a USB-C connector. In another embodiment, connector 21 is a Lightning connector.

Figure 3:
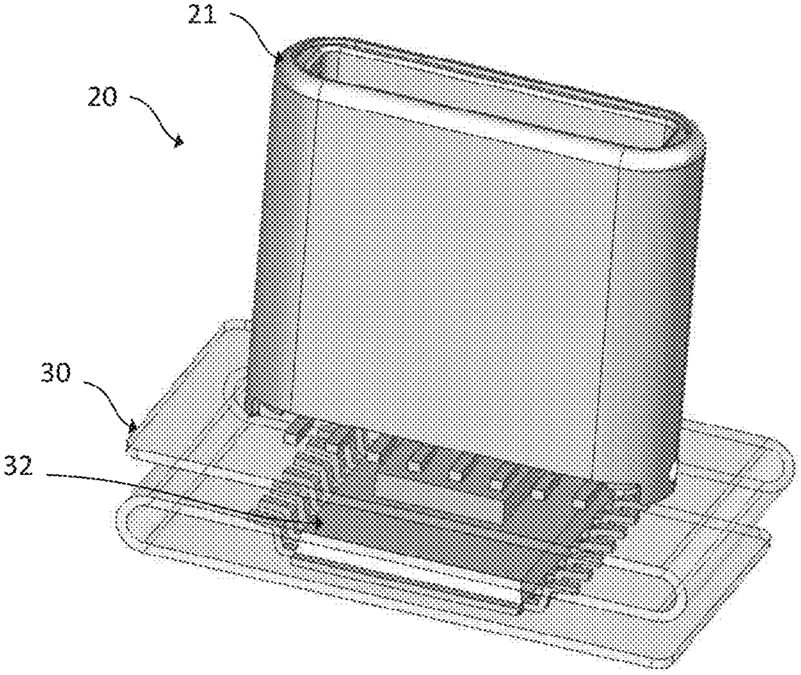
FIG. 3 shows a flexible printed circuit board assembly (PCBA) of the wireless dongle of FIG. 2 and components connected thereto, without the housing.

FIG. 3 shows the wireless dongle of FIG. 2, without housing 22, revealing a flexible printed circuit board assembly (PCBA 30) and connected components 32 folded to fit within housing 22, as discussed below.

Figure 4A:
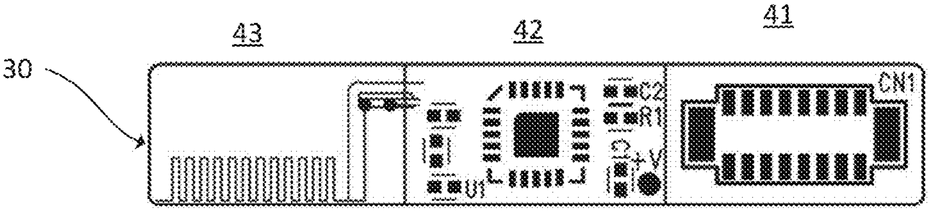
FIG. 4A is a plan view of the flexible PCBA and components of FIG. 3.
Figure 4B:
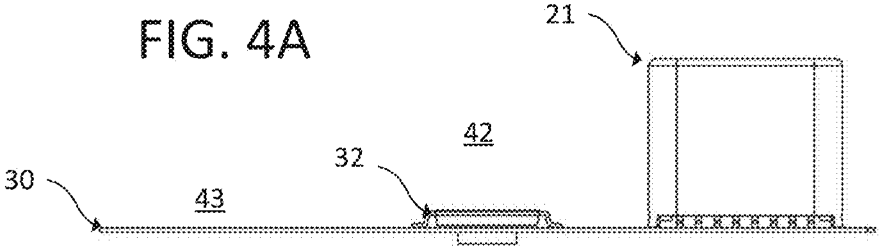
FIG. 4B is an elevation view of the housing, flexible PCBA and components of FIG. 3.
Figure 4C:
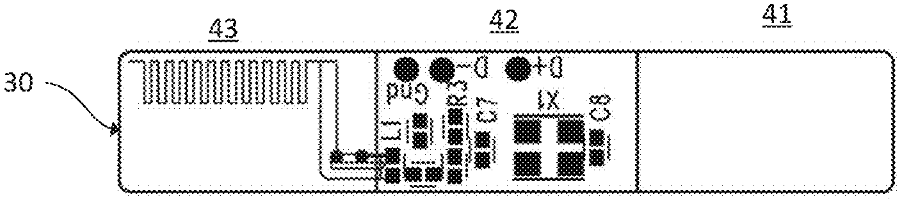
FIG. 4C is a bottom view of the flexible PCBA and components of FIG. 3.

FIGS. 4A-4C show three zones of the PCBA 30 and components 32: a connector zone 41 to which connector 21 is connected, a wireless components zone 42 and an antenna zone 43.

Figure 5:
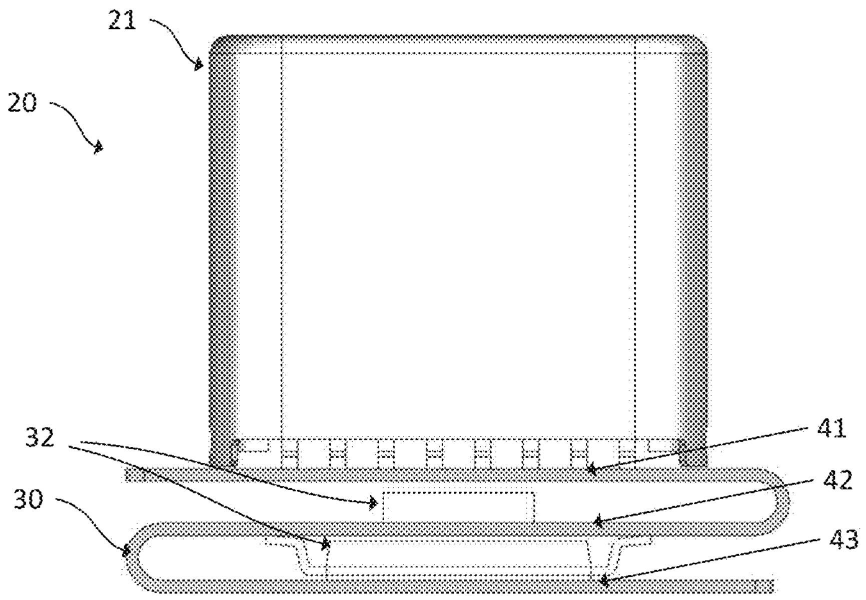
FIG. 5 shows the flexible PCBA, folded without the housing.
Figure 6:
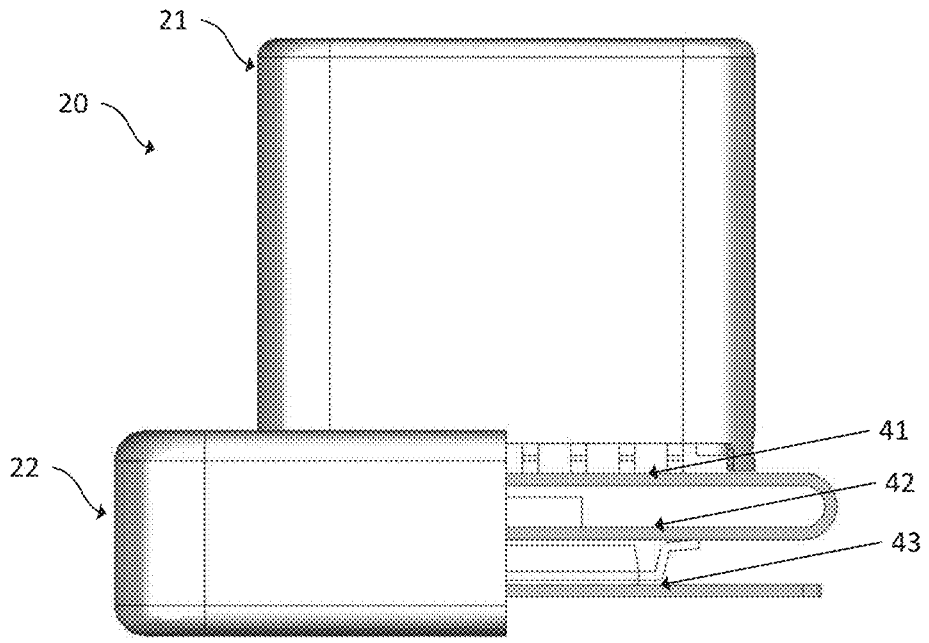
FIG. 6 shows the flexible PCBA, inserted into one half of the housing.

As shown in FIG. 3 and FIGS. 5 and 6, the flexible PCBA is folded in a serpentine configuration, such that the three zones 41, 42 and 43 stack on top of each other, with little or no gap between them. As shown in FIG. 3 and FIGS. 5 and 6, the thin PCBA 30 wraps around the components, in contrast with the prior art wherein the components effectively wrap around a thick circuit board.

Figure 7:
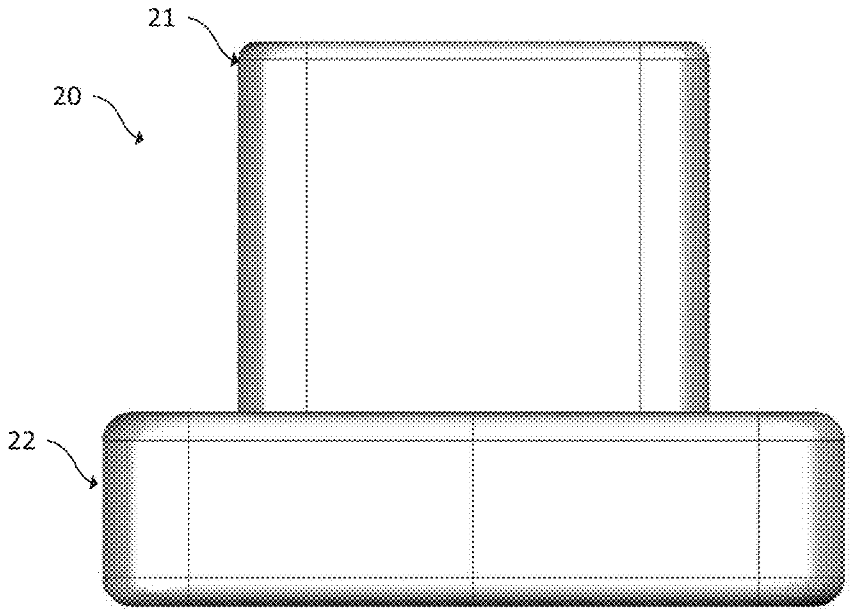
FIG. 7 shows the flexible PCBA within the housing.

The folded PCBA is inserted into housing 22, which can be made of plastic, to hold the PCBA and components 30, as shown in FIG. 7.

Figure 8:
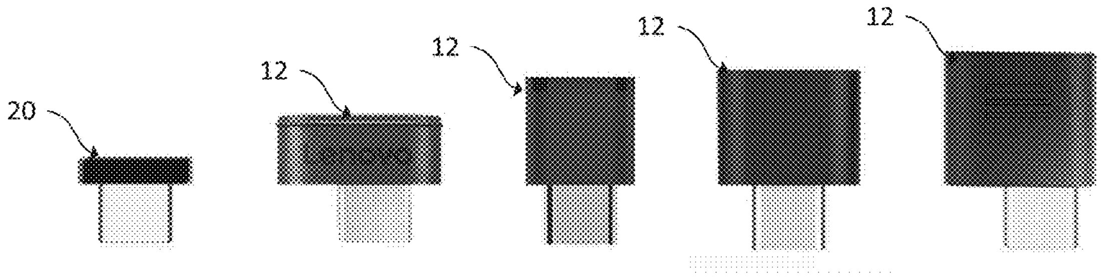
FIG. 8 shows the wireless dongle of FIGS. 1-7 and a plurality of prior art USB-C receivers, for size comparison.
Figure 9:
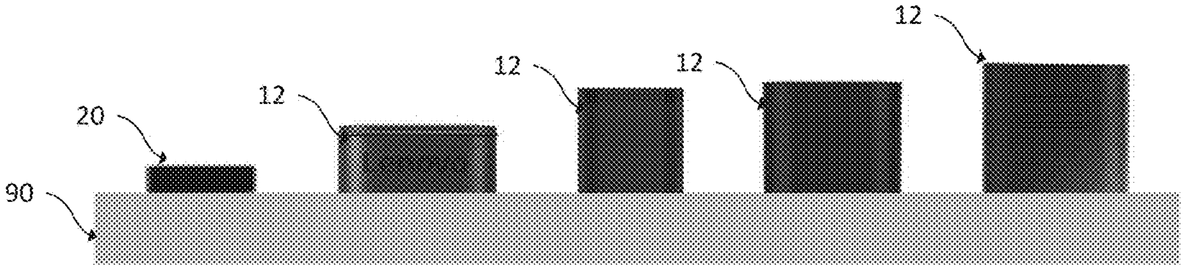
FIG. 9 shows the wireless dongle and plurality of prior art USB-C receivers of FIG. 8, inserted into a host device, for size comparison and extent of protrusion from the host device.

The wireless dongle 20 is significantly smaller than prior art USB-C receivers 12, as shown in FIG. 8, and protrudes from a host device 90 far less than prior art USB-C receivers 12, as shown in FIG. 9.

Figure 10:
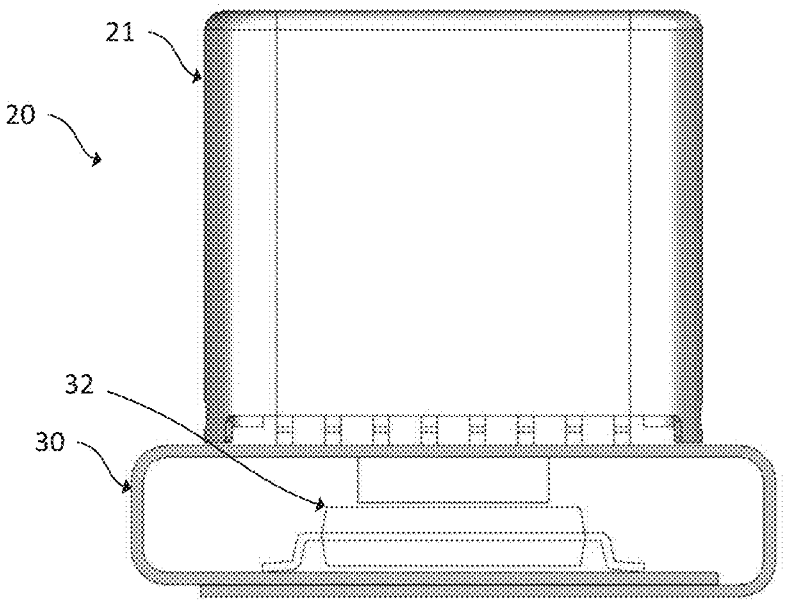
FIG. 10 shows the flexible PCBA folded in an overlapping fashion, with larger components, according to a further embodiment.

According to an alternative embodiment, the flexible PCBA 30 can be folded in an overlapping fashion, as shown in FIG. 10, to accommodate larger components 32A.

In embodiments, wireless dongle 20 can function as a nano receiver for larger connectors, such as USB-A.

In yet other embodiments, wireless dongle 20 can function as a flash memory drive or a security dongle.

In the embodiments set forth, housing 22 can be constructed from plastic, rubber or other suitable material, and can be assembled from separate parts, or overmolded using common techniques familiar to persons knowledgeable in the art.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A wireless dongle, comprising a:

a thin flexible printed circuit board assembly comprising a thin flexible printed circuit board having at least a connector zone, a zone for mounting components, and an antenna zone, wherein the connector zone, the zone for mounting components, and the antenna zone are portions of the same thin flexible printed circuit board;

a surface-mount connector coupled to a surface of the thin flexible printed circuit board in the connector zone and extending perpendicular to the surface, the surface-mount connector having an insertion end configured to be inserted into a corresponding port of a host device; and a housing enclosing the thin flexible printed circuit board assembly in a folded configuration, wherein the surface-mount connector protrudes from the housing.

2. The wireless dongle of claim 1, wherein in the folded configuration, the connector zone, the zone for mounting components, and the antenna zone stack on top of each other when folded into the housing such that the thin flexible printed circuit board wraps around the components.

3. The wireless dongle of claim 2, wherein the flexible printed circuit board assembly is folded in a serpentine configuration.

4. The wireless dongle of claim 2, wherein the flexible printed circuit board assembly is folded in an overlapping configuration.

5. The wireless dongle of claim 1, wherein the surface-mount connector is a USB Type-C connector.

6. The wireless dongle of claim 1, wherein the surface-mount connector is soldered to the surface.

7. The wireless dongle of claim 1, wherein the housing is constructed from one of either plastic or rubber.

8. The wireless dongle of claim 1, wherein the housing is constructed from separate parts.

9. The wireless dongle of claim 2, wherein the surface-mount connector is soldered to the surface.

10. The wireless dongle of claim 2, wherein the components function as a nano receiver.

11. The wireless dongle of claim 2, wherein the components function as a flash memory drive.

12. The wireless dongle of claim 2, wherein the components function as a security dongle.

* * * * *